(12) United States Patent
Kaper (10) Patent No.: US 9,584,072 B1
(45) Date of Patent: Feb. 28, 2017

(54) DC BIAS REGULATOR FOR CASCODE AMPLIFIER

(71) Applicant: Raytheon Company, Waltham, MA (US)

(72) Inventor: Valery S. Kaper, Winchester, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/825,476

(22) Filed: Aug. 13, 2015

(51) Int. Cl.
  *H03F 1/22* (2006.01)
  *H03F 1/30* (2006.01)
  *H03F 1/02* (2006.01)
  *H03F 3/193* (2006.01)

(52) U.S. Cl.
  CPC ........... *H03F 1/301* (2013.01); *H03F 1/0222* (2013.01); *H03F 3/193* (2013.01); *H03F 2200/451* (2013.01); *H03F 2200/504* (2013.01); *H03F 2200/72* (2013.01); *H03F 2200/75* (2013.01)

(58) Field of Classification Search
  CPC .... H03F 1/22; H03F 3/04; H03F 3/20; H03G 3/30
  USPC ......................................... 330/311, 285, 296
  See application file for complete search history.

(56) References Cited

U.S. PATENT DOCUMENTS

| | | | |
|---|---|---|---|
| 5,032,799 A | 7/1991 | Milberger et al. | |
| 5,506,544 A | 4/1996 | Staudinger et al. | |
| 5,793,194 A | 8/1998 | Lewis | |
| 6,515,547 B2 | 2/2003 | Sowlati | |
| 6,778,016 B2 | 8/2004 | Luo | |
| 7,253,678 B2 | 8/2007 | Kalb | |
| 7,397,309 B2 * | 7/2008 | Tanoi | H03F 1/086 330/296 |
| 7,911,279 B2 * | 3/2011 | Chow | H03F 1/223 330/296 |
| 7,961,049 B2 | 6/2011 | Busking et al. | |
| 8,493,154 B1 * | 7/2013 | Camargo | H03F 1/223 330/296 |
| 8,872,590 B2 * | 10/2014 | Kan | H03F 3/193 330/284 |
| 2009/0085664 A1 | 4/2009 | Yang et al. | |

(Continued)

OTHER PUBLICATIONS

Dechanslaud et al.; "Design of an Integrated Cascode Cell for Compact Ku-Band Power Amplifiers;" Proceedings of the 42$^{nd}$ European Microwave Conference; Oct. 29-Nov. 1, 2012; pp. 1091-1094.

(Continued)

*Primary Examiner* — Henry Choe
(74) *Attorney, Agent, or Firm* — Daly, Crowley, Mofford & Durkee, LLP (57) ABSTRACT

An amplifier having a pair of transistors arranged in a cascode amplifier arrangement serially connected to a first voltage source. A DC bias regulator is provided having: a DC bias circuit for producing a reference voltage at a control electrode of a first one of the pair of transistors: and a voltage combiner having a pair of inputs, a first of the pair of inputs being coupled to the reference voltage and a second one of the pair of inputs being coupled to the first voltage source. The DC bias regulator produces a DC bias voltage at a control electrode of a second one of the pair of transistors related to a combination of the reference voltage and the first voltage source.

37 Claims, 8 Drawing Sheets

(56) References Cited

U.S. PATENT DOCUMENTS

2010/0039168 A1 2/2010 Bettencourt
2010/0127776 A1 5/2010 Chow et al.

OTHER PUBLICATIONS

Millman; "A Useful Network Theorem;" Proceedings of the Institute of Radio Engineers; Sep. 1940; pp. 413-417.
Yamanake et al.; "Ku-band Low Noise MMIC Amplifier with Bias Circuit for Compensation of Temperature Dependence and Process Variation;" Microwave Symposium Digest, 2002 IEEE MTT-S International, vol. 3; Jun. 2-7, 2002; pp. 1427-1430.
U.S. Appl. No. 14/825,485, filed Aug. 13, 2015, Kaper.
Notification of Transmittal of the International Search Report and the Written Opinion of the International Searching Authority, or the Declaration, PCT/US2016/045701, dated Nov. 7, 2016, 1 page.
International Search Report, PCT/US2016/045701, dated Nov. 7, 2016, 5 pages.
Written Opinion of the International Searching Authority, PCT/US2016/045701, dated Nov. 7, 2016, 8 pages.

\* cited by examiner

FIG. 1
Prior Art

- In general case:

$$V_{out} = \frac{\frac{V_x}{R_x} + \frac{V_y}{R_y}}{\frac{1}{R_x} + \frac{1}{R_y}} = \frac{V_x R_y + V_y R_x}{R_x + R_y}$$

- In a specific case of $R_x = R_y$ $$V_{out} = \frac{V_x + V_y}{2}$$

DC BIAS REGULATOR FOR CASCODE AMPLIFIER

TECHNICAL FIELD

This disclosure relates generally to cascode amplifiers and more particularly to DC bias regulators for cascode amplifiers.

BACKGROUND

As is known in the art, a cascode amplifier may be formed with either Field Effect Transistors (FETs) or Bipolar Junction Transistors (BJTs). In the case of a FET a gate is used as a control electrode for controlling a flow of carriers between a source electrode and a drain electrode and in the case of a BJT a base electrode is used as a control electrode to control a flow of carriers between a collector electrode and a drain electrode. Thus, it should be noted that while a FET cascode amplifier is described, the material can be equivalently applied to a BJT. Thus, the gate electrode of a FET is equivalent to a base electrode of a BJT; either being referred to herein as a control electrode for the transistor. In like manner the terms drain and source may be interchanged for a FET as well as the terms emitter and collector for a BJT.

Thus, considering a Field Effect Transistor (FET) cascode amplifier, such FET cascode amplifier includes a common source (CS) connected FET serially connected to a common gate (CG) connected FET with the drain of the CS FET being coupled to the source of the CG FET; the drain of the common gate (CG) FET being coupled to a Vdd voltage supply. In a typical cascode arrangement, the sizes of the CS and CG FETs are equal (i.e. the total gate widths for the two transistors are the same Wg_cs=Wg_cg).

In general, DC biasing circuit or regulators, in order to operate effectively, must provide DC bias regulation (i.e. produce gate DC bias voltages for the CS and CG FETs or base DC bias voltages for BJTs) in such a way that the cascode amplifier performance (measured by DC drain/collector current, RF gain, noise figure, output power, linearity) is insensitive to variation in manufacturing process, temperature and external DC bias voltage. The first two variations typically manifest themselves as variations in transistor pinch off, Vp, or threshold voltage, An additional requirement, specific to a cascode amplifier, is a controlled division of Vdd (or Vcc for a bipolar cascode amplifier) between the drain to source voltage ($V_{ds}$) of the common gate FET (Vds_cg) drain-source junction and the drain to source voltage of the common source FET (Vds_cs) drain-source junction in order to ensure that both FETs are always in the saturation regime (Vds>Vknee), (where Vknee is the voltage at the knee of the saturation curve) so that the drain to source current (Ids) is nearly independent of Vds for both transistors in the cascode). For example, if Vdd=2V and Vknee=0.5V, one would like to avoid situations when Vds_cg=0.4V and Vds_cs=1.6V or Vds_cg=1.6V and Vds_cs=0.4V. Also, as is known in the art, the equal division results in the maximum output power and linearity of a cascode amplifier. Thus, a DC bias regulator for a cascode amplifier should be capable of enforcing a condition wherein the drain-source voltages for the common-source and common-gate (common-emitter and common-base) transistors are equal by design and remain equal in presence of variation in manufacturing process, temperature and external DC bias voltage.

One DC bias regulator for a cascode transistor amplifier is described in U.S. Pat. No. 5,032,799 inventor Milberger, et al., entitled "Multistage cascode radio frequency amplifier" issued Jul. 16, 1991. However, such DC bias regulator is a passive DC bias regulator circuit and therefore does not provide compensation for variations in manufacturing process, temperature and external DC bias voltage. Two active DC bias regulators are described in U.S. Pat. No. 5,506,544, inventor Staudinger et al., entitled "Bias Circuit for Depletion Mode Field Effect Transistors", issued Apr. 9, 1996 and in U.S. Pat. No. 7,961,049, Busking et al., entitled "Amplifier with compensated gate bias", issued Jun. 14, 2011; while these two DC bias regulators do compensate for process condition variations, they are specific for a common source FET and are used to maintain constant drain current through that single FET and not applicable for a cascode amplifier having a pair of FETs.

As is also known in the art, it is sometimes required that resistors used in an integrated circuit have a precise predetermined relationship in the value of their resistances for the circuit to operate properly. It is also known in the art that it is easier to fabricate resistor of equal resistance as compared fabricating resistors requiring a predetermined difference in resistance for proper operation of a circuit.

Figure 1:
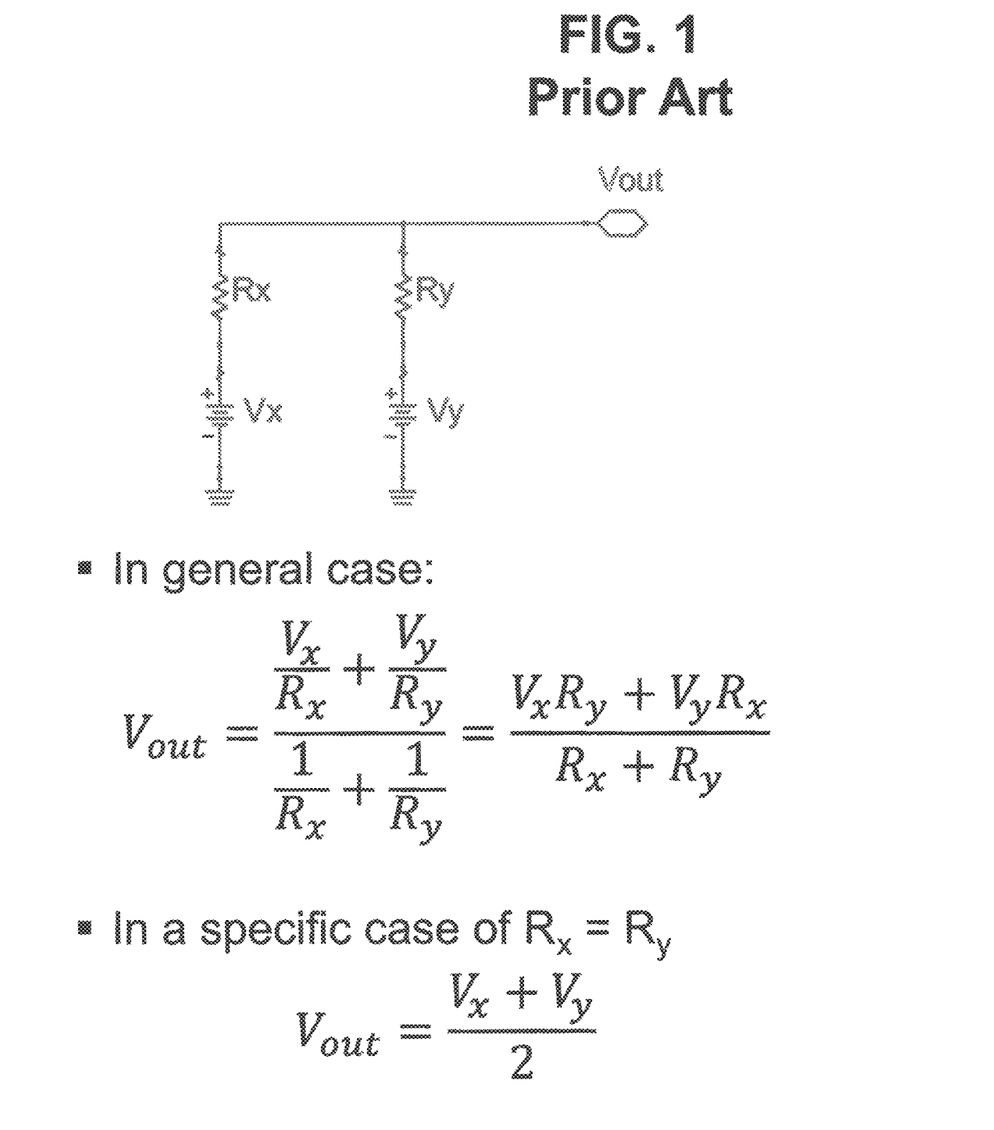
FIG. 1 is a schematic diagram of a Millman "Passive Averager" with two inputs according to the PRIOR ART.
Figure 2:
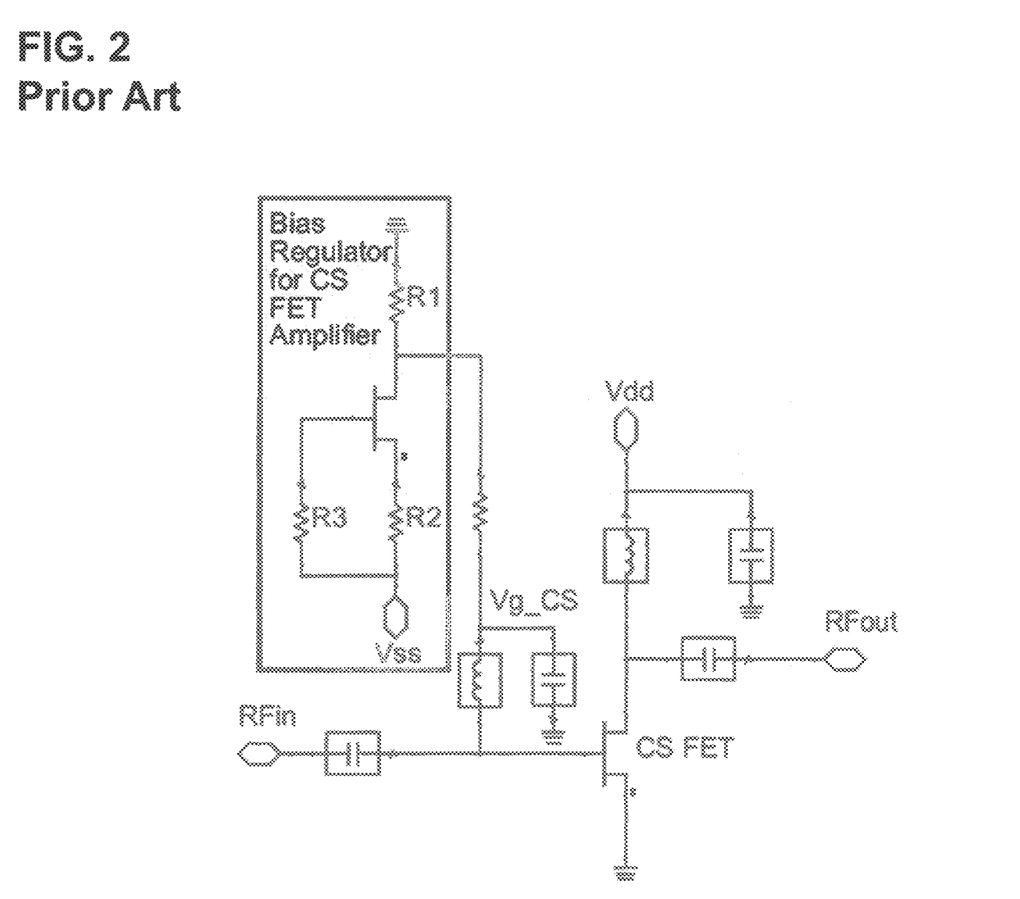
FIG. 2 is a schematic diagram of a common-source FET amplifier with bias regulator according to the PRIOR ART.

As is also known in the art, one circuit shown in FIG. 1, used to combine a pair of input voltages in a so-called Millman "Passive Averager", is described in an article entitled "A Useful Network Theorem" by Jacob Millman, published in the Proceedings of the IRE, September 1940, pages 413-471. As described therein, in a specific case an output voltage Vout is produced from a pair of input voltages Vx and Vy:

$$V_{out} = \frac{\frac{V_x}{R_x} + \frac{V_y}{R_y}}{\frac{1}{R_x} + \frac{1}{R_y}} = \frac{V_x R_y + V_y R_x}{R_x + R_y}$$

and in the specific case where $R_x = R_y$;

$$V_{out} = \frac{V_x + V_y}{2}$$

SUMMARY

In accordance with the present disclosure, an amplifier is provided having a pair of transistors arranged in a cascode amplifier arrangement serially connected to a first voltage source. A DC bias regulator is provided having: a DC bias circuit for producing a reference voltage at a control electrode of a first one of the pair of transistors: and a voltage combiner having a pair of inputs, a first of the pair of inputs being coupled to the reference voltage and a second one of the pair of inputs being coupled to the first voltage source. The DC bias regulator produces a DC bias voltage at a control electrode of a second one of the pair of transistors related to a combination of the reference voltage and the first voltage source.

In one embodiment, the DC bias circuit produces a reference current and wherein the reference voltage is related to the reference current.

The inventor has recognized that while U.S. Pat. No. 5,506,544 and U.S. Pat. No. 7,961,049 describe DC bias circuits for the gate electrode of a single common-source FET amplifier, the Applicant has devised a circuit that generates two DC bias voltages for gate electrodes of a cascode amplifier (one for the gate electrode of a cascode amplifier's common-source FET and the other for the gate electrode of a cascode amplifier's common-gate FET) in a such a way that:

a) The DC current flowing through the drain-source junctions of the two transistors is insensitive to variations in the transistors' pinch-off voltage whereby both voltages (one for the gate electrode of a cascode amplifier's common-source FET and the other for the gate electrode of a cascode amplifier's common-gate FET) track the pinch-off voltage;

b) The requisite controlled division of an external DC bias voltage between the drain-source junctions of the two cascode amplifier's transistors is enforced at the nominal condition as well as in the presence of variations in the transistors pinch-off voltage and/or variations in the external voltage source Vdd.

With such an arrangement, active, process and temperature invariant, DC bias is provided for both transistor in the cascode arrangement. More particularly, the bias regulator reduces cascode amplifier performance sensitivity to variations in the manufacturing process, temperature and external DC power sources; and enforces predetermined division of DC bias voltage between drain-source junctions of the cascode amplifier's common-gate and common-source transistors at a nominal operating condition as well as in the presence of variations in the operating conditions.

In one embodiment, the DC bias regulator comprises: a bias circuit; and a voltage combiner circuit. The pair of transistors of the cascode amplifier are serially connected to a first voltage source. The bias circuit produces: a first output voltage related to a reference current and a second voltage, the second voltage being a predetermined fraction of the first output voltage, the second voltage being coupled to as control electrode of a first one of the pair of transistors. The combiner circuit has a pair of inputs coupled to: the first output voltage produced by the bias circuit; and the first voltage source, respectively, to produce a DC bias voltage at a control electrode of the second transistor related to a combination of the first output voltage produced by the bias circuit and the first voltage source.

In one embodiment, the combiner circuit produces the DC bias voltage as a function of the sum of the output voltage produced by the first output voltage and the first voltage source.

In one embodiment, the combiner circuit produces the DC bias voltage as a function of the average of the output voltage produced by the first output voltage and the first voltage source.

In one embodiment, the combiner circuit is a Millman passive averager circuit.

In one embodiment, the DC bias voltage produced at a control electrode of the first transistor and the DC bias voltage produced at the control electrode of the second transistor are independent of the current passing serially though the drain-source path of both the first transistor and the second transistors.

In one embodiment, the combiner includes a pair of resistors, and wherein a first one of the pair of resistors is connected between a first one of the pair of inputs and an output of the combiner and a second one of the pair of resistors is connected between a second one of the pair of inputs and the output of the combiner.

In one embodiment, the pair of resistors has the same resistance.

In one embodiment, the DC bias regulator includes a voltage divider circuit and wherein the reference current passes through the voltage divider circuit.

In one embodiment, the voltage divider includes a pair of serially connected resistors and wherein the reference current passes through the serially connected resistors, one of the resistors producing the voltage coupled to a control electrode of the first one of the pair of transistors and the other one of the resistors producing the voltage coupled to the combiner.

In one embodiment, the pair of resistors in the voltage divider has the same resistance.

In one embodiment, the current through the reference transistor is a saturation current for the transistor and current from the voltage supply to the reference potential is a saturation current for both the first and second transistors.

In one embodiment, the DC bias voltages produced at control electrodes of the pair of transistors, the control electrodes controlling a flow of carriers between a pair of electrodes, the bias voltages providing equal voltages for the pair of electrodes of the pair of transistors.

In one embodiment, a cascode amplifier is provided having: a first transistor having a control electrode for controlling a flow of carriers between a first and second electrode; and a second transistor having a control electrode for controlling a flow of carriers between a first and second electrode. The first electrode of the first transistor is coupled to a reference potential, the first electrode of the second transistor is coupled to the second electrode of the first transistor, and the second electrode of the second transistor is coupled to a first voltage source. A DC bias regulator is provided having: a reference transistor coupled to a reference voltage; and a reference voltage divider circuit serially connected between the reference transistor and the reference voltage. The DC bias regulator produces a constant reference current through the reference transistor and the reference voltage divider produces: a first output voltage related to the reference current and a second voltage, the second voltage being a predetermined fraction of the first output voltage, the second voltage being coupled to the control electrode of the first transistor. A voltage combiner circuit has a pair of inputs coupled to: the first output voltage produced by the reference voltage producing circuit; and the first voltage source, respectively, to produce a DC bias voltage at the control electrode of the second transistor related to a combination of the first output voltage produced by the reference voltage and the first voltage source.

In one embodiment, the combiner divides the voltages Vds_cg and the voltage Vds_cs, unequally while maintaining both transistors saturation.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 4A and 4B are computer simulation results of the cascode amplifier of FIG. 3 using circuit models of GaAs FETs to represent transistors; FIG. 4A showing percent change in DC drain current, $I_{CASCODE}$, as a function of change in pinch of voltage for: (A) an cascode amplifier without any DC bias regulator; (B) a cascode amplifier with regulator to control DC bias of the gate electrode of only the common source FET; (C) a cascode amplifier according to the disclosure; FIG. 4B shows Vds_cg/Vds_cs ratio as a function of change in pinch off voltage for: (A) an cascode amplifier without any DC bias regulator; (B) a cascode amplifier with regulator to control DC bias of the gate electrode of only the common source FET; and (C) a cascode amplifier according to the disclosure;

Like reference symbols in the various drawings indicate like elements.

DETAILED DESCRIPTION

Figure 3:
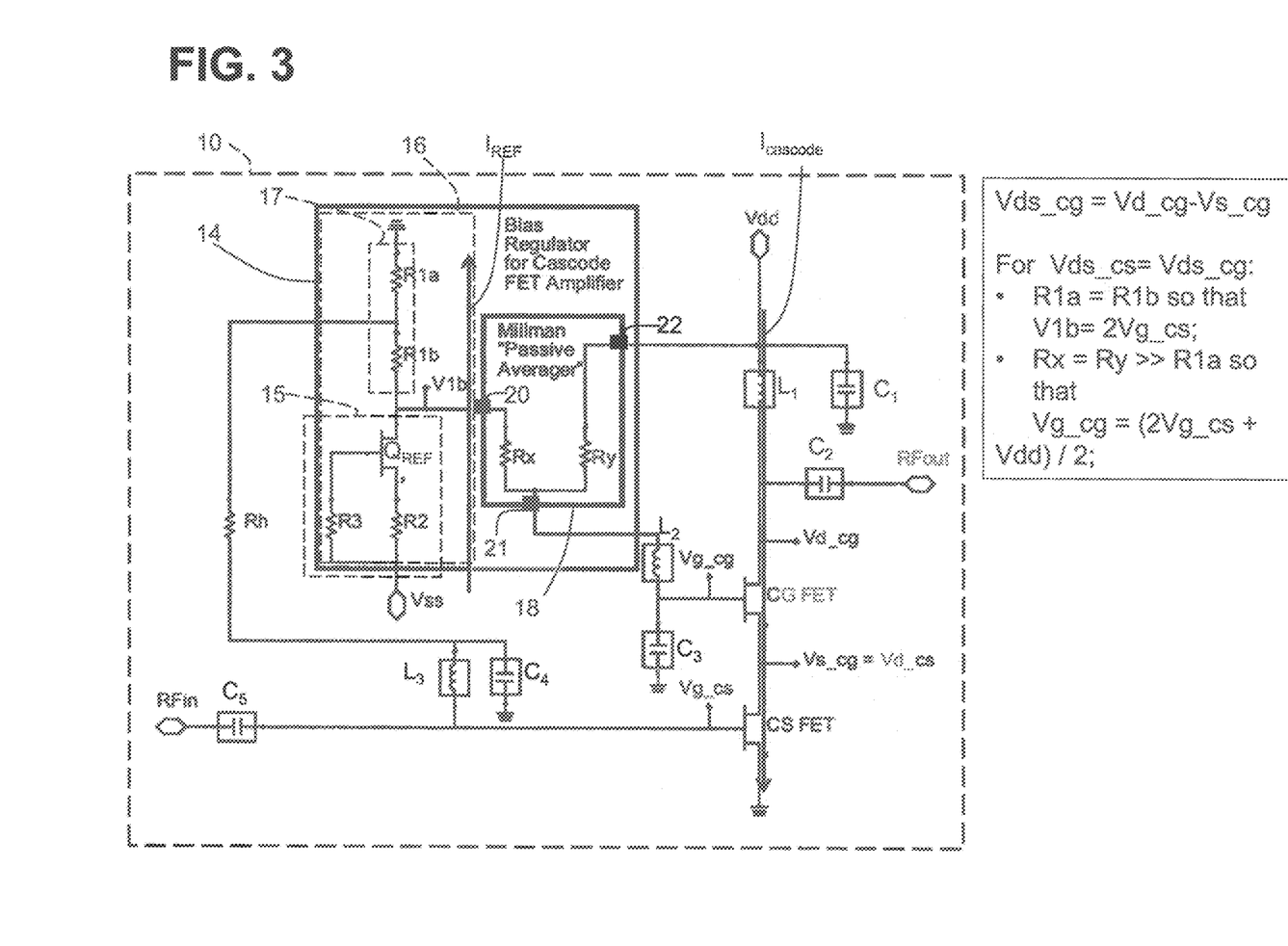
FIG. 3 is a schematic diagram of a cascode amplifier according to the disclosure.

Referring now to FIG. 3, an amplifier 10 is shown having: a pair of transistors, here FETS, CS FET and CG FET of equal total gate widths, Wg_cs=Wg_cg, arranged as a cascode amplifier 12, as shown, and a DC bias regulator 14. The pair of transistors CS FET and CG FET, of the cascode amplifier 10 is serially connected between a first voltage source, Vdd and ground potential, as shown. An input RF signal is fed to the gate of CS FET, as shown, for amplification by the amplifier 10 to produce an output RF signal at the drain of CG_FET, as indicated.

In order for the voltage Vds_cs between the source (S) and drain (D) electrodes of the CG FET to be equal to the voltage Vds_cg between the source (S) and drain (D) electrodes of the CS FET, Vd_cs needs to be equal to Vdd/2 (assuming that Vdd=Vd_cg, i.e., the RF choke L1 separating Vdd and Vd_cg has zero DC resistance). Note that in this commonly used notation, (A) Vds_cs=Vd_ cs−Vs_cs=Vd_cs since Vs_cs=0 and (B) Vds_cg=Vd_cg−Vs_cg=Vdd−Vd_cs.

In order for Vds_cs to be equal to Vds_cg, Vgs_cg needs to be equal to Vgs_cs because they share the same current $I_{CASCODE}$ and their sizes are equal Wg_cs=Wg_cg. It is noted that both the CG FET and the CS FET operate with a saturation current $I_{CASCODE}$ and the cascode arrangement is a current-sharing arrangement. Therefore, Vgs_cg=Vg_cg−Vs_cg=Vg_cg−Vd_cs=Vg_cg−Vdd/2; Vg_cg=Vdd/2+Vgs_cg. Since we want Vgs_cg to be equal to Vgs_cs, we want Vg_cg=Vdd/2+Vgs_cs. Thus, Vg_cg must equal [Vdd+2Vgs_cs]/2 in order for Vds_cs=Vds_cg.

It should be noted that Qref, CS FET and CG FET are all formed in near proximity on the same integrated circuit, so that both the semiconductor material properties and environmental conditions are the same for the three transistors. Thus, the reference transistor $Q_{REF}$, produces a reference current $I_{REF}$, here for example, the saturation current, through the source electrode S and drain electrode D of the reference transistor $Q_{REF}$, and through the serially connected resistors R1a and R1b. The DC bias regulator 14 produces bias voltages Vg_cs and Vg_cg for the gate electrodes of the CS FET and CG FET, respectively, as a function of the reference current $I_{REF}$ through the reference transistor $Q_{REF\ and}$ the serially connected resistors R1a and R1b.

More particularly, the DC bias regulator 14 includes a bias circuit 16 and a voltage combiner circuit 18, here a Millman averaging circuit, FIG. 1. The bias circuit 16 includes a reference transistor $Q_{REF}$, connected as a current source 15, serially connected between a voltage Vss and ground through a voltage divider 17, having serially connected resistors R1a and R1b, as shown. The voltage divider 17 of the bias circuit 16 produces: a first output voltage V1b related to the reference current $I_{REF}$ and the sum of resistors R1a and R2b (i.e., V1b=$I_{REF}$ (R1a+R1b) and a second voltage, Vg_cs=$I_{REF}$ R1a/(R1a+R1b). Thus, Vg_cs is a predetermined fraction R1a/(R1a+R1b) of the output voltage V1b, the second voltage Vg_cs being coupled to the control electrode, here the gate electrode G of a first one of the pair of transistors, here CS FET.

The combiner circuit 18 has a pair of inputs 20, 22 coupled to: the first output voltage Vg_cs produced by the voltage divider 17 and the first voltage source, Vdd, respectively, to produce a DC bias voltage Vg_cg at the control electrode, here the gate electrode G of the second transistor CG FET related to a combination of the first output voltage Vg_cs and the first voltage source Vdd. More particularly, here R1a=R1b so that Vg_cs=V1b/2 and therefore with Rx and Ry of the combiner 18 being equal and being much greater than R1a, so that the combiner circuit 18 produces the DC bias voltage Vg_cg as a function of the sum of the voltage V1b and the first voltage source Vdd; here [V1b+Vdd]/2. Since, V1b=2Vg_cs, Vg_cg=[2Vg_cs+Vdd]/2 and therefore as described above, the voltage Vds_cg across the source and drain electrodes S, D of the CG FET will be equal to the voltage Vds_cs across the source drain electrode S, D of the CS FET. It should be noted that in this arrangement, Vg_cg does not have direct dependence on $I_{CASCODE}$, only through Vg_cs. It should also be noted that Vg_cg traces Vg_cs, i.e. if the pinch-off voltage for CS, CG and Qref FETs changes due to manufacturing and/or temperature, both Vg_cs and Vg_cg get adjusted automatically by the bias regulator arrangement to keep the $I_{CASCODE}$ constant and Vds_cs=Vds_cg.

Finally it is noted that because R1a=R1b (as noted above, fabrication of resistors or equal resistances is very precise), the voltage divider 17 produces a voltage Vg_cs which is precisely one half of the output voltage fed to input 20 of the combiner 18 (that is, from the equations described above, Vdd will split between Vds_cs and Vds_cg independent of the actual voltage Vdd). Therefore, the voltage Vds_cg across the source and drain electrodes S, D of the CG FET will be equal to the voltage Vds_cs across the source drain electrodes S, D of the CS FET independent of the actual voltage of Vdd resulting in a circuit independent of variations in Vdd and is, as described in detail below, independent of variations in pinch off voltage, Vp:

Referring to FIG. 3, according to the Millman Theorem described above:

$$V_{g\_cg} = \frac{\frac{V_{dd}}{R_y} + \frac{V_{1b}}{R_x}}{\frac{1}{R_y} + \frac{1}{R_x}} \quad (1)$$

If we select $R_y=R_x$ and assume that L2 has zero DC resistance, then:

$$V_{g\_cg} = \frac{V_{dd} + V_{1b}}{2} \quad (2)$$

We need to ensure that (it is assumed that L1 has zero DC resistance):

$$V_{ds\_cg} = V_{ds\_cs} \Leftrightarrow V_{d\_cs} = \frac{V_{dd}}{2} \quad (3)$$

For this to be true, the following must be enforced (assuming that L3 has zero DC resistance, the voltage drop across Rh is negligible, and CS FET and CG FET have the same total gate width Wg_cs=Wg_cg)

$$V_{gs\_cg}=V_{gs\_cs} \Leftrightarrow V_{g\_cg}-V_{s\_cg}=V_{gs\_cs} \Leftrightarrow V_{g\_cg}=V_{dd}/2+V_{gs\_cs} \quad (4)$$

$$V_{g\_cg} = \frac{V_{dd} + 2V_{g\_cs}}{2} \quad (5)$$

If R1a=R1b (assuming that Rx>>R1a), the equal voltage division Vds_cg=Vds_cs in (3) is enforced from (2) and (5) by ensuring that V1b=2Vg_cs.

Thus, in summary and referring to FIG. 3:

For the voltage across the source-drain of the CS FET (Vds_cs) to be equal to the voltage across the source-drain of the CG FET (Vds_cg):

Vg_cg should be equal to (Vdd+2Vg_cs)/2;

R1a=R1b so that the voltage V1b at the first input 20 of the Millman "Passive Averager" 18 is equal to 2Vg_cs;

Rx=Ry>>R1a so that:

the voltage Vg_cg at the output 21 of the Millman "Passive Averager" is equal to the average of the voltages at the Millman "Passive Averager" inputs 20 and 22 thus satisfying the condition of Vg_cg= (Vdd+2Vg_cs)/2 to enforce Vds_cs=Vds_cg;

the current through resistor Rx of the Millman "Passive Averager" is much smaller than the reference current Iref through the reference transistor Qref.

To complete the circuit 10, the RF input signal is fed to the gate electrode G of the CS FET through a conventional DC blocking capacitor C5, drain of the CG FET is coupled to the RF output through a DC blocking capacitor C2.C1, C3 and C4 DC are bypass capacitors that along with RF blocking inductors L1-L3 allow for DC connection between the bias regulator and Vdd on one side and transistors CS_FET and CG_FET on the other while preventing an RF connection. Resistor Rh provides additional low-frequency (where L3 and C4 are no longer effective in blocking the AC signal) isolation between the bias regulator and the gate electrode G of the CS FET.

Figure 4A:
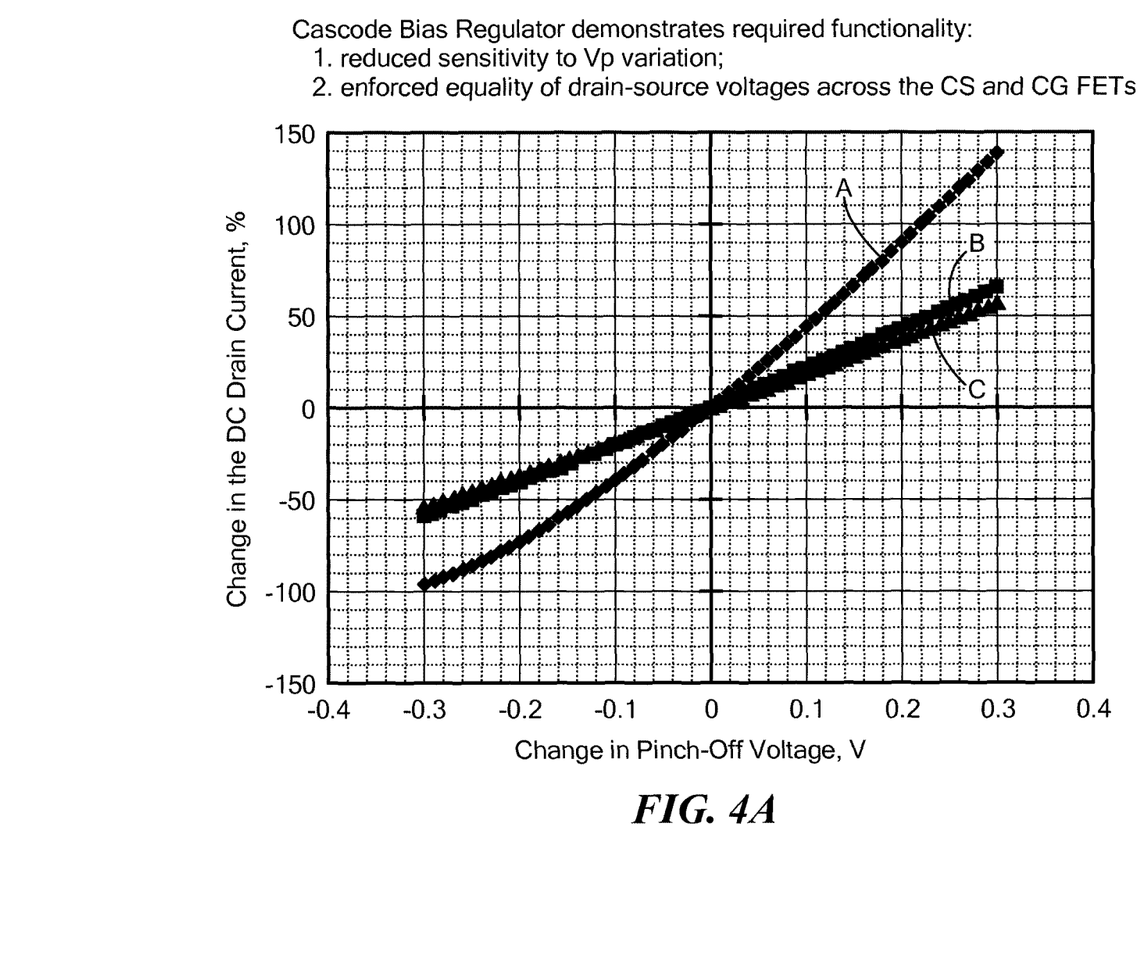
Figure 4B:
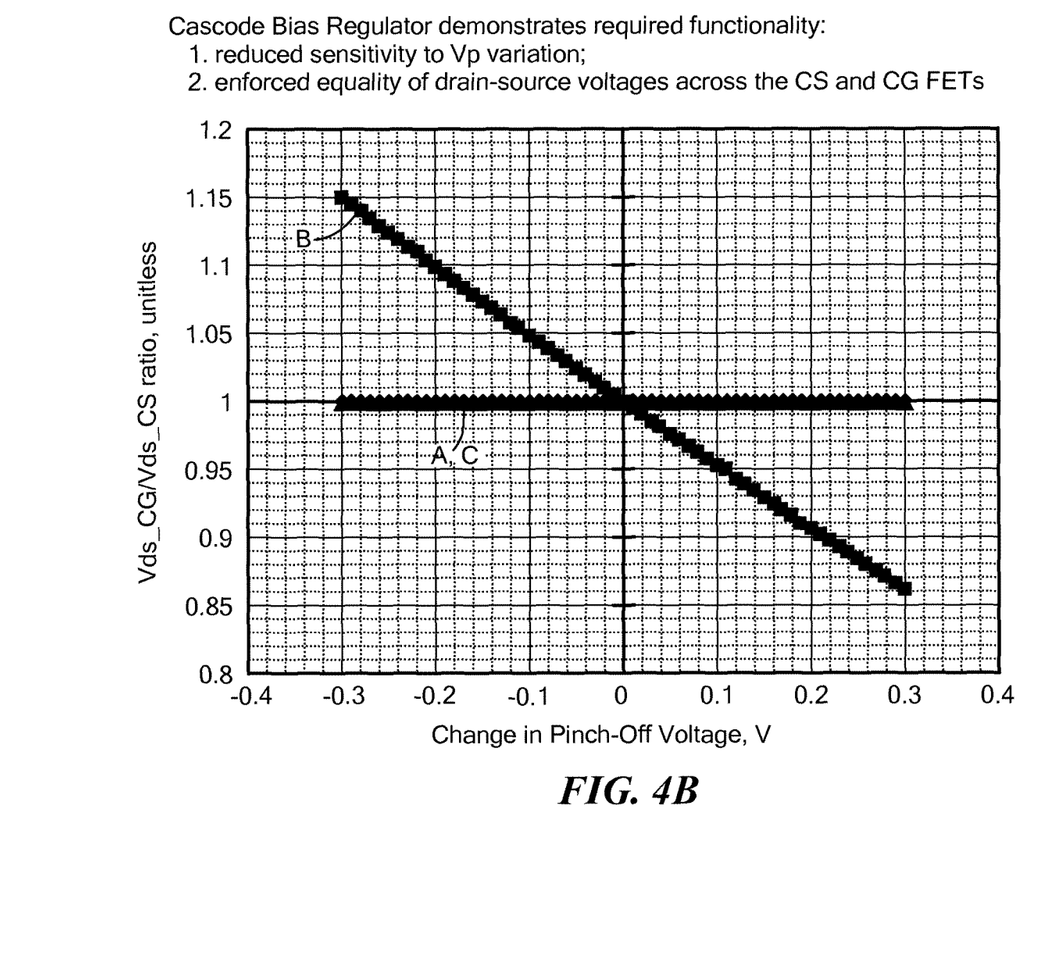

Referring now to FIGS. 4A and 4B, FIGS. 4A and 4B show computer simulation results of the cascode amplifier of FIG. 3; FIG. 4A showing percent change in DC drain current, $I_{CASCODE}$, as a function of change in pinch off voltage for: (A) an cascode amplifier without any DC bias regulator; (B) a cascode amplifier with regulator to control DC bias of the gate electrode of only the common-source FET; (C) a cascode amplifier according to the disclosure and FIG. 4B shows Vds_cg/Vds_cs ratio as a function of change in pinch of voltage for (A) an cascode amplifier without any DC bias regulator; (B) a cascode amplifier with regulator to control DC bias of the gate electrode of only the common-source FET; (C) a cascode amplifier according to the disclosure. The curves demonstrate that the Cascode DC Bias Regulator demonstrates the required functionality:

1. reduced sensitivity to pinch-off voltage, Vp, variation;
2. enforced equality of drain-source voltages across the FET CS and FET CG.

Figure 5:
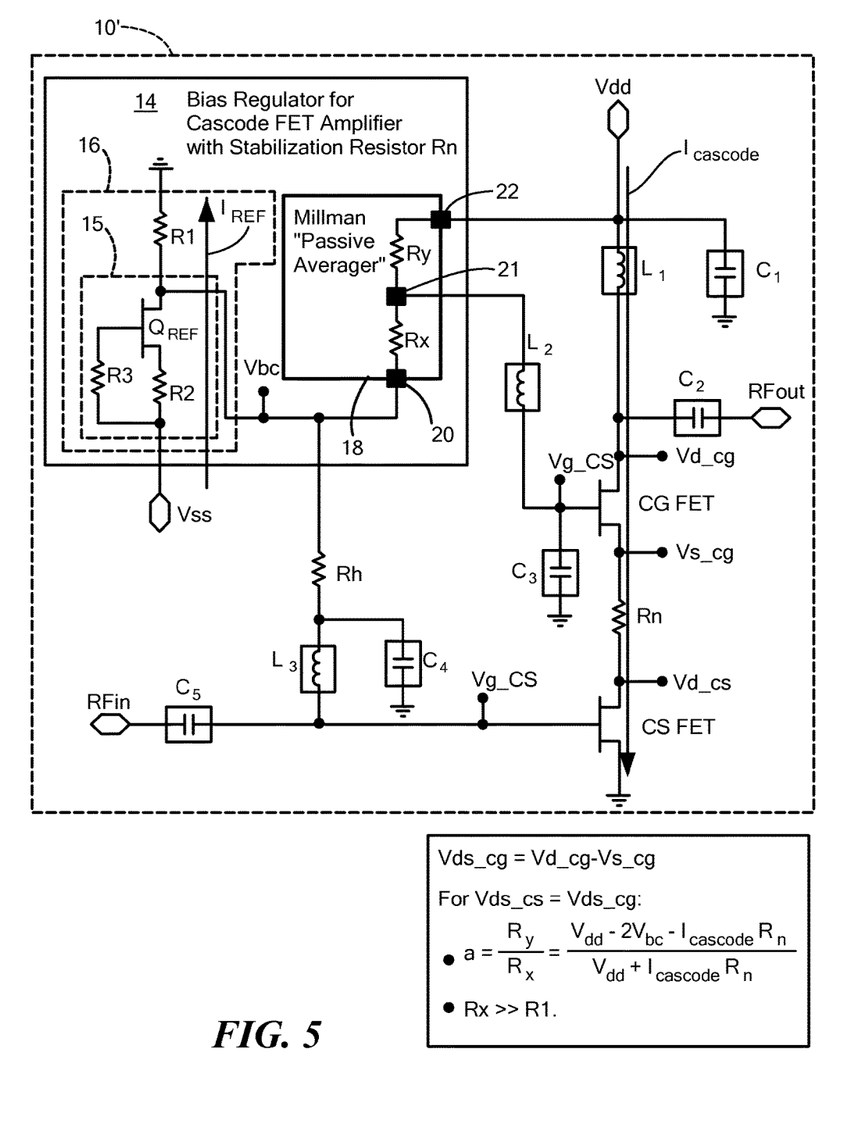
FIG. 5 is a schematic diagram of a cascode amplifier having a stabilization resistor coupled between the pair of cascode arranged transistors according to the disclosure.

Referring now to FIG. 5, a cascode amplifier 10' is shown. Here, a stabilization resistor Rn is connected between the source of the CG FET and the drain of the CS FET, as shown. The function of the resistor Rn is to improve circuit's stability at the expense of lowering its gain. Because of the inclusion of the resistor Rn, to ensure Vds_cs=Vds_cg, the resistance values for resistors Rx and Ry now need to satisfy the ratio shown and derived in equation (16).:

Referring to FIG. 5, according to the Millman Theorem (assuming that L2 has zero DC resistance):

$$V_{g\_cg} = \frac{\frac{V_{dd}}{R_y} + \frac{V_{bc}}{R_x}}{\frac{1}{R_y} + \frac{1}{R_x}} \quad (6)$$

If $R_y=aR_x$ and Rx>>R1, then:

$$V_{g\_cg} = \frac{V_{dd} + aV_{bc}}{a + 1} \quad (7)$$

We need to ensure that:

$$V_{ds\_cg}=V_{ds\_cs} \Leftrightarrow V_{d\_cg}-V_{s\_cg}=V_{d\_cs} \quad (8)$$

For this to be true, the following must be enforced (assuming that Vg_cs1=Vbc, in other words, L3 has zero DC resistance and the voltage drop across Rh is negligible, and also making CS FET and CG FET have the same total gate width Wg_cs=Wg_cg)

$$V_{gs\_cg}=V_{gs\_cs} \Leftrightarrow V_{gs\_cg}=V_{bc} \Leftrightarrow V_{g\_cg}=V_{s\_cg}+V_{bc} \quad (9)$$

Now, we need to express $V_{s\_cg}$ in terms of $R_k$, $R_l$, $R_n$, $V_{dd}$ and $I_{cascode}$ (assuming L1 has zero DC resistance)

$$V_{d\_cg}=V_{dd} \quad (10)$$

$$V_{ds\_cg}+V_{d\_cs}=V_{dd}-I_{cascode}R_n \quad (11)$$

Since $V_{ds\_cg}=V_{d\_cs}$ $$V_{d\_cs} = \frac{V_{dd} - I_{cascode}R_n}{2} \quad (12)$$

$$V_{s\_cg} = V_{d\_cs} + I_{cascode}R_n = \frac{V_{dd} + I_{cascode}R_n}{2} \quad (13)$$

From (9) and (13)

$$V_{g\_cg} = V_{s\_cg} + V_{bc} = \frac{V_{dd} + I_{cascode}R_n}{2} + V_{bc} \quad (14)$$

Combining (7) and (14)

$$\frac{V_{dd} + aV_{bc}}{a+1} = \frac{V_{dd} + I_{cascode}R_n}{2} + V_{bc} \quad (15)$$

Using (15), the ratio a=Ry/Rx, which enforces Vds_cs=Vds_cg, can be derived as:

$$a = \frac{R_y}{R_x} = \frac{V_{dd} - 2V_{bc} - I_{cascode}R_n}{V_{dd} + I_{cascode}R_n} \quad (16)$$

Figure 6:
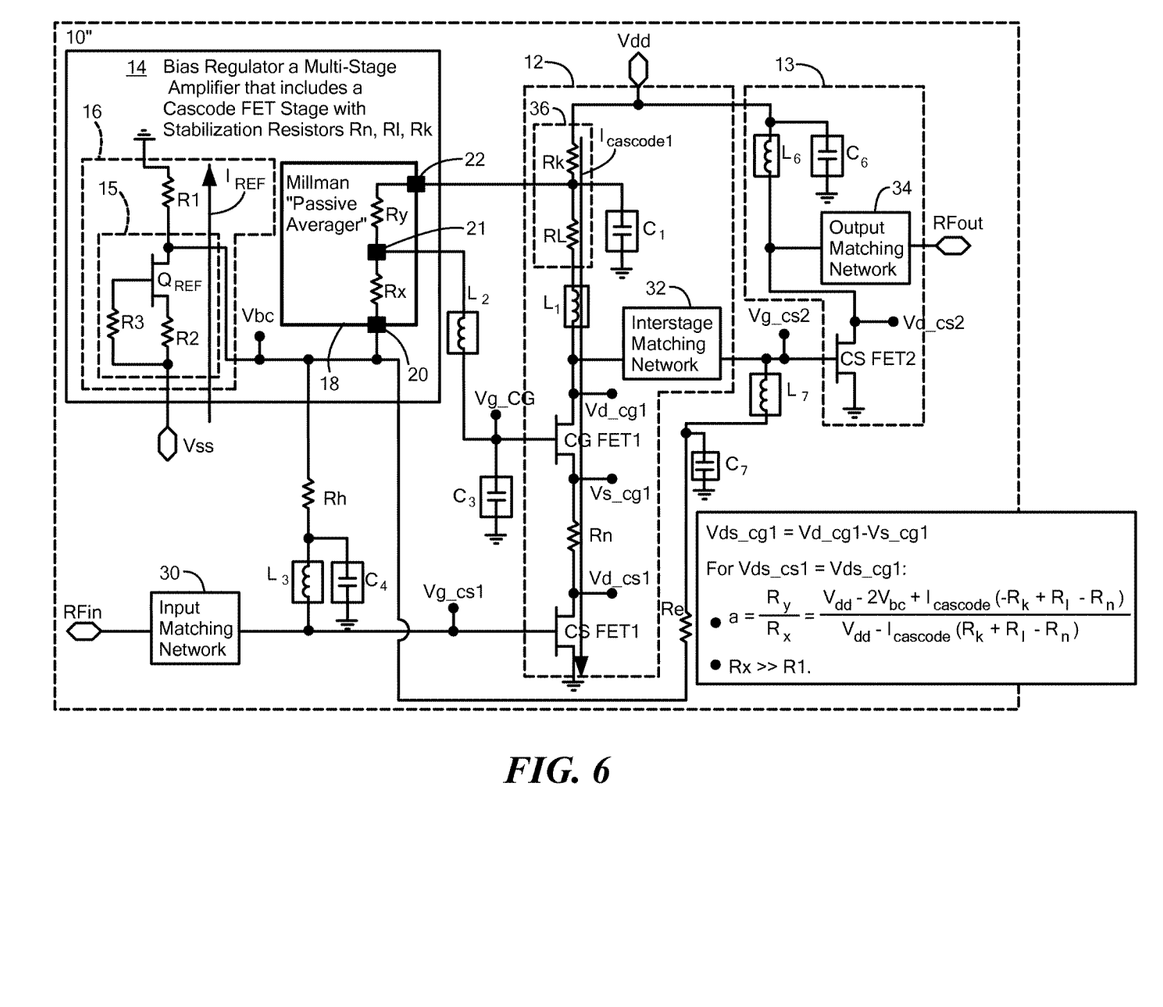
FIG. 6 is a schematic diagram of a two-stage cascaded amplifier having a first cascode amplifier stage feeding a second common-source amplifier stage according to the disclosure.

Referring now to FIG. 6, a two-stage cascade amplifier 10" having a first cascode amplifier stage 12' feeding a second. common-source amplifier stage 13' is shown. Further, it is noted that here, because of the cascade of the two amplifiers 14' and 13', input, interstage, and output matching networks 30, 32, and 34, respectively, are included as shown. Here, in order to improve stability of the an 10', the cascode amplifier 12' also includes the resistor Rn connected serially between the source of CG FET1 and the drain of CS FET2, as shown. Also included is an isolation circuit 36, here resistors Rk and RL, serially connected between Vdd and the drain of CG FET1, as shown to improve low frequency (i.e., at frequencies much lower than the frequency of the RF input signal) isolation between the cascade amplifier stage 12' and the common-source amplifier stage 13'; the impedance matching between the cascade amplifier stage 12 and the common-source amplifier stage 13' being provided by the interstage matching network 32. It is noted that also included are by-pass capacitors C1, C3, C4, C6 and C7 and RF chokes L2, L6 and L7, arranged as shown.

It is also noted that the bias circuit 16' includes only one resistor R1 serially connected to the current source 15. Here, the current source produces a reference current $I_{REF}$, as indicated. The reference current $I_{REF}$ passes through R1 to produce an output voltage Vbc from the DC bias circuit 16', as indicated. The output voltage Vbc is fed to:

(A) the gate of CS FET1 to provide a DC bias voltage Vg_cs1 through RF choke L3 and resistor Rh, here used to enhance low frequency isolation between the bias regulator 14 and the transistor CS FET1;

(B) the gate of CS FET2 of the common-source stage 13' to provide a DC bias voltage Vg_cs2 through low-frequency isolating resistor Re and RF choke L7; and, (C) the input 20 of the voltage combiner circuit 18, as shown.

The second input 22 of the combiner is fed a voltage at the junction between resistors Rk and RL, as shown. Thus, the voltage at input 22 is a fraction of the voltage Vdd, as to be described.

The values Rx and Ry for the resistors in the combiner 18 are calculated based on is chosen Rk, RL, and Rn values to enforce equal drain-source voltage division for the CS and CG FETs within the cascade amplifier 12'; more particularly that Vds_cs of CS FET1 ($V_{ds\_CS\ FET1}$) be equal to Vds_cg of CG FET1 $V_{ds\_CG\ FET1}$. More particularly, to ensure that $V_{ds\_CS\ FET1}=V_{ds\_CG\ FET1}$, the relation (27), shown and derived below, must be satisfied:

Referring to FIG. 6, according to the Millman Theorem (assuming that L2 has zero DC resistance)

$$V_{g\_cg} = \frac{\frac{V_{dd} - I_{cascode1}R_k}{R_y} + \frac{V_{bc}}{R_x}}{\frac{1}{R_y} + \frac{1}{R_x}} \quad (17)$$

If $R_y=aR_x$ and Rx>>R1, then:

$$V_{g\_cg} = \frac{V_{dd} - I_{cascode1}R_k + aV_{bc}}{a+1} \quad (18)$$

We need to ensure that:

$$V_{ds\_cg1}=V_{ds\_cs1} \Leftrightarrow V_{d\_cg1}-V_{s\_cg1}=V_{d\_cs1} \quad (19)$$

For this to he true, the following must be enforced (assuming that Vg_cs1=Vbc, in other words, L3 has zero DC resistance and the voltage drop across Rh is negligible, and also making CS FET and CG FET have the same total gate width Wg_cs=Wg_cg)

$$V_{gs\_cg}=V_{gs\_cs} \Leftrightarrow V_{gs\_cg}=V_{bc} \Leftrightarrow V_{g\_cg}=V_{s\_cg1}+V_{bc} \quad (20)$$

Now, we need to express $V_{g\_cg1}$ in terms of $R_k$, $R_l$, $R_n$, $V_{dd}$ and $I_{cascode}$. Assuming L1 has zero DC resistance $$V_{ds_{cg1}}+V_{d_{cs1}}=V_{d_{cg1}}-I_{cascode1}R_n \quad (21)$$

$$V_{d_{cg1}}=V_{dd}-I_{cascode1}(R_k+R_l) \quad (22)$$

Since $V_{ds\_cg1}=V_{d\_cs1}$ $$V_{d\_cs1} = \frac{V_{d\_cg1} - I_{cascode1}R_n}{2} = \frac{V_{dd} - I_{cascode1}(R_k + R_l + R_n)}{2} \quad (23)$$

$$V_{s\_cg1} = V_{d\_cs1} + I_{cascode1}R_n = \frac{V_{dd} - I_{cascode1}(R_k + R_l - R_n)}{2} \quad (24)$$

From (20) and (24)

$$V_{g\_cg} = V_{s\_cg1} + V_{bc} = \frac{V_{dd} - I_{cascode1}(R_k + R_l - R_n)}{2} + V_{bc} \quad (25)$$

Combining (18) and (25)

$$\frac{V_{dd} - I_{cascode1}R_k + aV_{bc}}{a+1} = \frac{V_{dd} - I_{cascode1}(R_k + R_l - R_n)}{2} + V_{bc} \quad (26)$$

Using the ratio a=Ry/Rx, which enforces Vds_cs1=Vds_cg1, can be derived as:

$$a = \frac{R_y}{R_x} = \frac{V_{dd} - 2V_{bc} + I_{cascode1}(-R_k + R_l - R_n)}{V_{dd} - I_{cascode1}(R_k + R_l - R_n)} \quad (27)$$

Alternatively, Ry and Rx can be set to obtain an arbitrary relationship between $V_{ds\_CS1}$ and $V_{ds\_CG1}$.

Rk and RL are typically set to small resistance values to have small associated DC voltage drops across them. At the same time their non-zero resistances help to reduce quality factors of potential resonances associated with electrical interconnections and the reactive circuit components L1, L6, C1 and C6. In turn, lower resonances' quality factors improve circuit's stability.

Figure 7A:
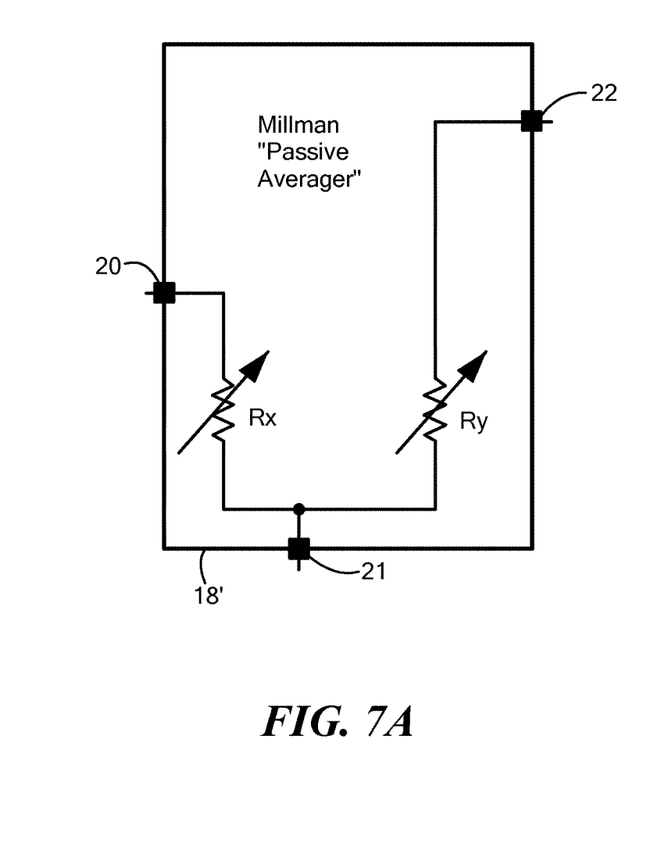
FIG. 7A is a schematic of a Millman "Passive Averager" with two inputs and with variable resistors Rx and Ry.
Figure 7B:
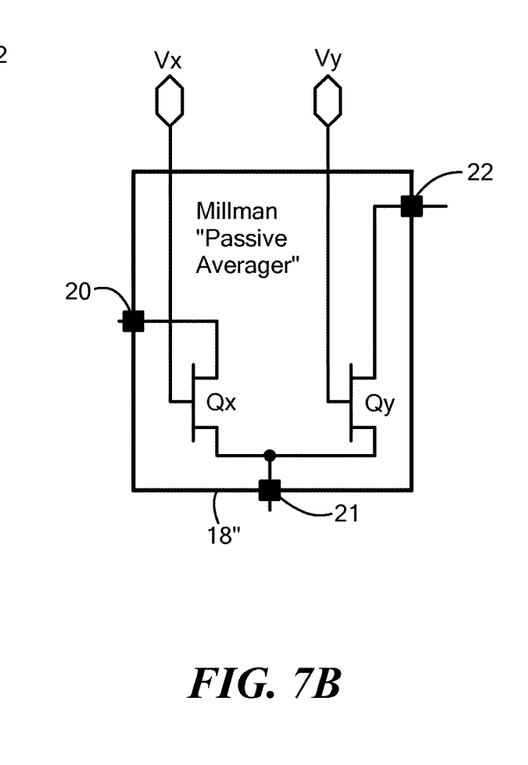
FIG. 7B is a schematic of a Millman "Passive Averager" with two inputs and with voltage-variable resistors implemented as transistors Qx and Qy.

A number of embodiments of the disclosure have been described. Nevertheless, it will be understood that various modifications may be made without departing from the spirit and scope of the disclosure. For example, as noted above, the transistors may be BJTs. Further, the resistors Rx and Ry and R1a and R1b may be selected to produce a ratio of Vds_cs to Vds_cg other than 1. Note, that if R1a and R1b are kept constant, changing Rx and Ry can produce different Vds_cs/Vds_cg ratios without changing the current flowing through the cascode between Vdd and ground. Further, the resistors Rx and Ry may be implemented as variable resistors, shown in FIG. 7A to dynamically change the Vds_cs/Vds_cg ratio. Further, the resistors Rx and Ry may be implemented as voltage-variable resistors in the form of field-effect transistors (FETs) Qx and Qy, shown in FIG. 7B, where two external voltages Vx and Vy applied to the control (gate) electrodes of such FETs) set the drain-source resistances of the FETs Qx and Qy respectively. Thus, it should be noted that while one DC bias circuit 16 has been used to produce the reference current as described, other bias circuits may be used. Accordingly, other embodiments are within the scope of the following claims.

What is claimed is:

1. An amplifier, comprising:
   a pair of transistors arranged in a cascode amplifier arrangement serially connected to a first voltage source;
   a DC bias regulator, comprising:
      a DC bias circuit for producing a reference voltage at a control electrode of a first one of the pair of transistors:
      a voltage combiner having a pair of inputs, a first of the pair of inputs being coupled to the reference voltage and a second one of the pair of inputs being coupled to the first voltage source to produce a DC bias voltage at a control electrode of a second one of the pair of transistors related to a combination of the reference voltage and the first voltage source; and
   wherein the combiner includes a pair of resistors, and wherein a first one of the pair of resistors is connected between a first one of the pair of inputs and an output of the combiner and a second one of the pair of resistors is connected between a second one of the pair of inputs and the output of the combiner.

2. The amplifier recited in claim 1 wherein the pair of resistors have the same resistances.

3. The amplifier recited in claim 1 wherein the pair of resistors have different resistances.

4. The amplifier recited in claim 1 wherein the pair of resistors have variable resistances.

5. The amplifier recited in claim 1 wherein the DC bias regulator includes a voltage divider circuit and wherein the reference current passes through the voltage divider circuit.

6. The amplifier recited in claim 5 wherein the voltage divider includes a pair of serially connected resistors and wherein the reference current passes through the serially connected resistors, one of the resistors producing the voltage coupled to the control electrode of the first one of the pair of transistors and the combination of the resistors producing the voltage coupled to the combiner.

7. The amplifier recited in claim 1 wherein the DC bias regulator includes a voltage divider circuit and wherein the reference current passes through the voltage divider circuit.

8. The amplifier recited in claim 7 wherein the voltage divider includes a pair of serially connected resistors and wherein the reference current passes through the serially connected resistors, the combination of the resistors producing the voltage coupled to the combiner and the other one of the resistors producing the voltage coupled to the control electrode of the first one of the pair of transistors.

9. The amplifier recited in claim 8 wherein the pair of resistors in the voltage divider have the same resistance.

10. An amplifier, comprising:
    a pair of transistors arranged in a cascode amplifier arrangement serially connected to a first voltage source;
    a DC bias regulator, comprising:
       a DC bias circuit for producing a reference voltage at a control electrode of a first one of the pair of transistors:
       a voltage combiner having a pair of inputs, a first of the pair of inputs being coupled to the reference voltage and a second one of the pair of inputs being coupled to the first voltage source to produce a DC bias voltage at a control electrode of a second one of the pair; and
    wherein the DC bias regulator comprises:
    a voltage divider;
    wherein the voltage divider produces: a first output voltage related to the reference current and a second voltage, the second voltage being a predetermined fraction of the first output voltage, the second voltage being coupled to a control electrode of a first one of the pair of transistors;
    wherein the combiner circuit has a pair of inputs coupled to: the first output voltage produced by the voltage divider; and the first voltage source, respectively, to produce the DC bias voltage at the control electrode of the second one of the pair of transistors related to a combination of the first output voltage produced by the reference voltage and the first voltage source.

11. The amplifier recited in claim 10 wherein the combiner circuit produces the DC bias voltage as a function of the sum of the output voltage produced by the reference voltage and the first voltage source.

12. The amplifier recited in claim 11 wherein the combiner circuit produces the DC bias voltage as a function of the average of the output voltage produced by the reference voltage and the first voltage source.

13. The amplifier recited in claim 11 wherein the current through the reference transistor is a saturation current for the reference transistor and current from the voltage supply to the reference potential is a saturation current for both the first one of the pair of transistors and the second one of the pair of transistors.

14. A cascode amplifier, comprising:
    a first transistor having a control electrode for controlling a flow of carriers between a first and second electrode;
    a second transistor having a control electrode for controlling a flow of carriers between a first and second electrode;
    wherein the first electrode of the first transistor is coupled to a reference potential, the first electrode of the second transistor is coupled to the second electrode of the first transistor, and the second electrode of the second transistor is coupled to a first voltage source;
    a DC bias regulator, comprising:
       a reference transistor coupled to a second voltage source;
       a reference voltage divider circuit serially connected between the reference transistor and the reference potential;
       wherein the DC bias regulator produces a reference current through the reference transistor and the reference voltage divider produces: a first output voltage related to the reference current and a second voltage, the second voltage being a predetermined fraction of the first output voltage, the second voltage being coupled to the control electrode of the first transistor;
    a voltage combiner circuit having a pair of inputs coupled to: the first output voltage produced by the reference voltage divider circuit; and the first voltage source, respectively, to produce a DC bias voltage at the control electrode of the second transistor related to a combination of the first output voltage produced by the reference voltage divider circuit and the first voltage source.

15. The cascode amplifier recited in claim 14 wherein the combiner circuit produces the DC bias voltage as a function of the sum of the output voltage produced by the reference voltage and the first voltage source.

16. The cascode amplifier recited in claim 15 wherein the combiner circuit produces the DC bias voltage as a function of the average of the output voltage produced by the reference voltage and the first voltage source.

17. The cascode amplifier recited in claim 16 wherein the current through the reference transistor is a saturation current for the reference transistor and current from the voltage supply to the reference potential is a saturation current for both the first and second transistors.

18. The cascode amplifier recited in claim 14 wherein the DC bias voltages produced at the control electrodes of the first transistor and the second transistor produces a voltage across the first and second electrodes the first transistor equal to the voltage across the first and second electrodes of the second transistor.

19. An amplifier comprising:
a first transistor having a control electrode for controlling a flow of carriers between a first electrode and a second electrode of the first transistor, the first electrode being coupled to a voltage source;
a second transistor having a control electrode for controlling a flow of carriers between a first electrode and a second electrode of the second transistor, the second electrode being coupled to a reference potential;
a resistor having one end connected to the second electrode of the first transistor and a second end connected to the first electrode of the second transistor;
a DC bias regulator, comprising:
a reference transistor;
wherein the DC bias regulator produce a reference current through the reference transistor; and
wherein the DC bias regulator produces DC bias voltages for each of the pair of transistors as a function of the reference current through the reference transistor; and,
wherein the DC bias regulator comprises:
a voltage combiner circuit;
wherein the DC bias regulator produces: a voltage related to the reference current, such voltage being coupled to a control electrode of a first one of the pair of transistors;
wherein the combiner circuit has a pair of inputs coupled to: the voltage produced by the DC bias regulator and the voltage source, respectively, to produce a bias voltage at a control electrode of a second one of the pair of transistors related to a combination of the voltage produced by the voltage regulator and the voltage source.

20. The amplifier recited in claim 19 wherein the combiner is a Millman passive averager.

21. The amplifier recited in claim 19 wherein the DC bias voltage produced at the control electrode of the second one of the pair of transistors is independent of variations on a current passing serially through both the first one of the pair of transistors and the second one of the pair of transistors.

22. The amplifier recited in claim 19 wherein the combiner includes a pair of resistors, and wherein a first one of the pair of resistors is connected between a first one of the pair of inputs and an output of the combiner and a second one of the pair of resistors is connected between a second one of the pair of inputs and the output of the combiner.

23. The amplifier recited in claim 22 wherein the pair of resistors have the same resistances.

24. The amplifier recited in claim 22 wherein the pair of resistors have the different resistances.

25. The amplifier recited in claim 22 wherein the pair of resistors have the variable resistance.

26. The amplifier recited in claim 19 wherein the DC bias regulator includes a voltage divider circuit and wherein the reference current passes through a voltage divider circuit.

27. The amplifier recited in claim 26 wherein the voltage divider includes a pair of serially connected resistors and wherein the reference current passes through the serially connected resistors, one of the resistors producing the voltage coupled to the control electrode of the first one of the pair of transistors and the other one of the resistors producing the voltage coupled to the combiner.

28. The amplifier recited in claim 22 wherein the DC bias regulator includes a voltage divider circuit and wherein the reference current passes through voltage divider circuit.

29. The amplifier recited in claim 28 wherein the voltage divider includes a pair of serially connected resistors and wherein the reference current passes through the serially connected resistors, the combination of the resistors producing the voltage coupled to the control electrode of the first one of the pair of transistors and the other one of the resistors producing the voltage coupled to the combiner.

30. The amplifier recited in claim 29 wherein the pair of resistors in the voltage divider have the same resistance.

31. The amplifier recited in claim 19 wherein the DC bias regulator comprises:
a bias circuit;
a voltage combiner circuit;
wherein the bias circuit produces: a first output voltage related to the reference current and a second voltage, the second voltage being a predetermined fraction of the first output voltage, the second voltage being coupled to the control electrode of the second transistor;
wherein the combiner circuit has a pair of inputs coupled to: the first output voltage produced by the voltage divider; and the first voltage source, respectively, to produce a DC bias voltage at the control electrode of the first transistor related to a combination of the first output voltage produced by the reference voltage and the voltage source.

32. The amplifier recited in claim 30 wherein the combiner circuit produces the DC bias voltage as a function of the sum of the output voltage produced by the reference voltage and the voltage source.

33. The amplifier recited in claim 32 wherein the combiner circuit produces the DC bias voltage as a function of the average of the output voltage produced by the reference voltage and the voltage source.

34. The amplifier recited in claim 32 wherein the current through the reference transistor is a saturation current for the reference transistor and current from the voltage supply to the reference potential is a saturation current for both the first transistor and the second transistor.

35. The amplifier recited in claim 1 wherein the combiner is a Millman passive averager.

36. The amplifier recited in claim 10 wherein the combiner is a Millman passive averager.

37. The amplifier recited in claim 14 wherein the combiner is a Millman passive averager.

\* \* \* \* \*